United States Patent
Tomida et al.

(10) Patent No.: US 10,790,431 B2
(45) Date of Patent: Sep. 29, 2020

(54) METHOD OF MANUFACTURING THERMOELECTRIC CONVERSION MATERIAL

(71) Applicant: FURUKAWA CO., LTD., Tokyo (JP)

(72) Inventors: Taketoshi Tomida, Ibaraki (JP); Shogo Suzuki, Ibaraki (JP); Atsuro Sumiyoshi, Ibaraki (JP); Ge Nie, Ibaraki (JP); Takahiro Ochi, Ibaraki (JP); Masaaki Kikuchi, Ibaraki (JP); Junqing Guo, Ibaraki (JP)

(73) Assignee: FURUKAWA CO., LTD., Tokyo (JP)

( * ) Notice: Subject to any disclaimer, the term of this patent is extended or adjusted under 35 U.S.C. 154(b) by 0 days.

(21) Appl. No.: 16/081,805

(22) PCT Filed: Feb. 27, 2017

(86) PCT No.: PCT/JP2017/007322
§ 371 (c)(1),
(2) Date: Aug. 31, 2018

(87) PCT Pub. No.: WO2017/154629
PCT Pub. Date: Sep. 14, 2017

(65) Prior Publication Data
US 2019/0097115 A1  Mar. 28, 2019

(30) Foreign Application Priority Data
Mar. 7, 2016  (JP) .................................. 2016-043195

(51) Int. Cl.
*H01L 35/34* (2006.01)
*B22F 3/105* (2006.01)
(Continued)

(52) U.S. Cl.
CPC .............. *H01L 35/34* (2013.01); *B22F 3/105* (2013.01); *H01L 35/16* (2013.01); *H01L 35/18* (2013.01); *H01L 35/22* (2013.01)

(58) Field of Classification Search
None
See application file for complete search history.

(56) References Cited

U.S. PATENT DOCUMENTS 5,929,351 A * 7/1999 Kusakabe .............. C22C 1/0491
                                              136/201
2011/0120517 A1 * 5/2011 Li ........................ B22D 11/0611
                                              136/203
(Continued)

FOREIGN PATENT DOCUMENTS

DE  102009024667  9/2010
JP  S49005803 B  2/1974
(Continued)

OTHER PUBLICATIONS

International Search Report dated May 16, 2017 filed in PCT/JP2017/007322.
(Continued)

*Primary Examiner* — Eli S Mekhlin
(74) *Attorney, Agent, or Firm* — Rankin, Hill & Clark LLP

(57) ABSTRACT

A method of manufacturing a thermoelectric conversion material includes a sintering step. In the sintering step, a sintered body of a sintered material (20) is obtained by applying a voltage to a conductive mold (10) in a first direction so as to cause energization under the condition in which an insulating layer (30) is disposed in at least a portion between an inner wall (12) of the mold (10) and the sintered material (20) and the insulating layer (30) keeps (Continued)

having insulating properties. Here, the sintered body is a thermoelectric conversion substance.

11 Claims, 10 Drawing Sheets

(51) Int. Cl.
　　*H01L 35/16* (2006.01)
　　*H01L 35/18* (2006.01)
　　*H01L 35/22* (2006.01)

(56) References Cited

U.S. PATENT DOCUMENTS

2012/0118343 A1* 5/2012 Iida .................. C04B 35/58085
　　　　　　　　　　　　　　　　　　　　　136/200
2015/0207056 A1　7/2015 Iida

FOREIGN PATENT DOCUMENTS

| JP | S58215305 A | 12/1983 |
| JP | H11012606 A | 1/1999 |
| JP | 2000239071 A | 9/2000 |
| JP | 2002363614 A | 12/2002 |
| JP | 2006339284 A | 12/2006 |
| JP | 2011049538 A | 3/2011 |

OTHER PUBLICATIONS

Extended European Search Report (EESR) dated Oct. 1, 2019 issued in the corresponding European patent application No. 17762969.8.

* cited by examiner

METHOD OF MANUFACTURING THERMOELECTRIC CONVERSION MATERIAL

TECHNICAL FIELD

The present invention relates to a method of manufacturing a thermoelectric conversion material.

BACKGROUND ART

As a method of manufacturing a thermoelectric conversion material, there is a method of electric sintering a powdery material.

Patent Document 1 discloses a method of attaching an insulating plate that causes dielectric breakdown when a temperature rises to a surface of a die which forms a sintering chamber in electric pressure sintering. In the technique disclosed in Patent Document 1, a current path is changed by dielectric breakdown of the insulating plate during sintering. With this, a temperature gradient occurring between a center portion and an outer peripheral portion in a case of sintering a material with excellent conductivity is suppressed, and variations in sintering state and density are reduced. Specifically, before the dielectric breakdown, a material is heated from the outside by Joule heat generated by current flowing through the die, and after the dielectric breakdown, the inside of the material is heated by Joule heat generated in the powder.

Patent Document 2 discloses a method in which a powder material is electrically sintered on a surface in contact with a die or a punch with a semiconductive layer interposed therebetween. According to the technique disclosed in Patent Document 2, by interposing the semiconductive layer, micro discharge occurring at a contact surface between the powder material and a mold is reduced and temperature distribution in the powder material at the time of energization is made substantially uniform.

RELATED DOCUMENT

Patent Document

[Patent Document 1] Japanese Unexamined Patent Publication No. 2002-363614
[Patent Document 2] Japanese Unexamined Patent Publication No. 2000-239071

SUMMARY OF THE INVENTION

Technical Problem

However, it was found out that, in a case of attempting to obtain a thermoelectric conversion material by an electric sintering method, there is a problem that a current flows in the thermoelectric conversion substance to cause a Peltier effect, and thereby a temperature difference occurs between the positive electrode side and the negative electrode side. This problem is particularly significant in a case of attempting to obtain a large sintered body, and thus it was difficult to obtain a uniform sintered body. As a result, in the manufacturing method in which a large-sized sintered body is manufactured and then diced or the like so as to make it into an individual piece of the thermoelectric conversion material, variations are caused in the properties of the thermoelectric conversion material obtained from one sintered body.

The present invention provides a method of manufacturing a thermoelectric conversion material capable of manufacturing a thermoelectric conversion material with stable quality.

Solution to Problem

According to the present invention, there is provided a method of manufacturing a thermoelectric conversion material, the method including a sintering step of obtaining a sintered body of a sintered material by applying a voltage to a conductive mold in a first direction so as to cause energization under the condition in which an insulating layer is disposed in at least a portion between an inner wall of the conductive mold and the sintered material, and the insulating layer keeps having insulating properties, in which the sintered body is a thermoelectric conversion substance.

Advantageous Effects of Invention

According to the present invention, it is possible to provide a method of manufacturing a thermoelectric conversion material capable of manufacturing a thermoelectric conversion material with stable quality.

BRIEF DESCRIPTION OF THE DRAWINGS

The above objects and other objects, features and advantages will become more apparent from the following description of the preferred embodiments and the accompanying drawings.

DESCRIPTION OF EMBODIMENTS

Figure 1:
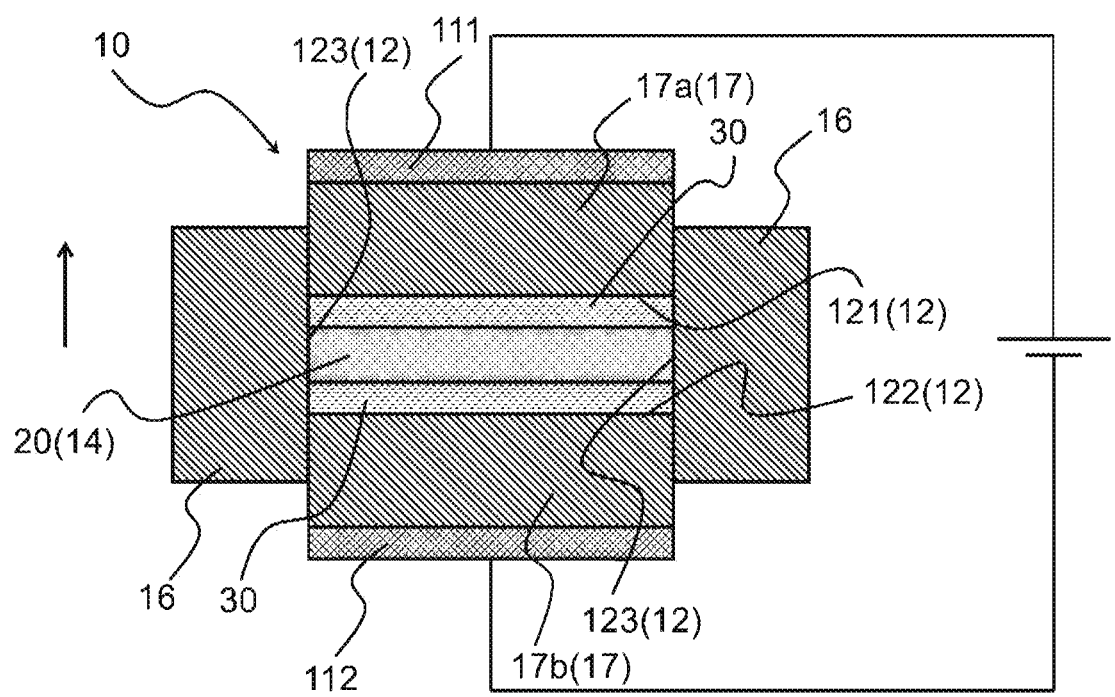
FIG. 1 is a diagram for illustrating a method of manufacturing a thermoelectric conversion material according to a first embodiment.

Hereinafter, embodiments of the present invention will be described with reference to the drawings. In all the drawings, similar components are denoted by the same reference numerals, and description thereof is omitted as appropriate.

First Embodiment

FIG. 1 is a diagram showing a method of manufacturing a thermoelectric conversion material according to a first embodiment. The method of manufacturing a thermoelectric conversion material according to this embodiment includes a sintering step. In the sintering step, a sintered body of a sintered material 20 is obtained by applying a voltage to a conductive mold 10 in a first direction so as to cause energization under the condition in which an insulating layer 30 is disposed in at least a portion between an inner wall 12 of the conductive mold 10 and the sintered material 20, and the insulating layer 30 keeps having the insulating properties. Here, the sintered body is a thermoelectric conversion substance. Details will be described below.

Note that, the thermoelectric conversion substance means a substance causing thermoelectric conversion performance. In addition, a sintered material 20 according to this embodiment is a substance having the thermoelectric conversion performance at least after sintering.

In this embodiment, the mold 10 includes, for example, a die 16 and a punch 17. The die 16 is, for example, a cylindrical member, and the punch 17 is a member which is fitted inside the die 16. Further, the mold 10 includes a first punch 17a and a second punch 17b as the punch 17. A space is formed inside the die 16 and between the first punch 17a and the second punch 17b so as to fill the inside of the die with sintered material 20. The punch 17 is movable with respect to the die 16 in the direction parallel to the longitudinal direction of a cylinder, and in the sintering step, one of the first punch 17a and the second punch 17b is pushed toward the other so as to apply a pressure to the sintered material 20.

Materials of the die 16 and the punch 17 are not particularly limited, but examples thereof include graphite, metal, and ceramics. The electrical resistivity of the mold 10 may be higher or lower than the electrical resistivity of the sintered material 20.

Then, the first punch 17a is electrically connected to a positive electrode 111, and the second punch 17b is electrically connected to a negative electrode 112. In the sintering step, a voltage is applied between the positive electrode 111 and the negative electrode 112. The inner wall 12 of the mold 10 has a first surface 121 close to the positive electrode 111 and a second surface 122 close to the negative electrode 112. In addition, in the sintering step, an insulating layer 30 is disposed so as to cover the first surface 121 and the second surface 122. Note that, the insulating layer 30 may cover the whole of the first surface 121 and the second surface 122, or may cover only a part thereof.

In addition, as described above, in the sintering step, a voltage is applied to the first direction (in the drawings, indicated by a straight arrow) of the mold 10. Also, the amount of current flowing is controlled. The applied voltage is a DC voltage or a pulse voltage. In the sintering step, the voltage application state and the non-application state may be switched or repeated, or the magnitude of the voltage may be changed halfway. The current flowing between the positive electrode 111 and the negative electrode 112 is, for example, a pulse current. In the sintering step, a state in which the current flows and a state in which the current does not flow may be switched or repeated, or the amount of the current may be changed halfway. Here, a potential relationship between the positive electrode 111 and the negative electrode 112 need not be reversed. According to the method of manufacturing a thermoelectric conversion material according to this embodiment, temperature unevenness in the sintering step can be reduced as will be described later without reversing the polarity of the power supply.

As described above, in the sintering step, the insulating layer 30 is disposed at least a portion between the inner wall 12 of the conductive mold 10 and the sintered material 20. Then, a voltage is applied between the positive electrode 111 and the negative electrode 112 under the condition in which the insulating layer 30 keeps having the insulating properties. From the beginning to the end of the sintering step, the insulating layer 30 keeps having the insulating properties without causing dielectric breakdown or the like. In other words, in the method of manufacturing a thermoelectric conversion material according to this embodiment, at the time of applying the voltage to the sintered material 20, the insulating layer 30 usually has insulating properties.

Specifically, the electrical resistivity of the insulating layer 30 is higher than the electrical resistivity of the sintered material 20. The thickness of the insulating layer 30 is not particularly limited as long as it is thick enough to prevent a current from flowing at an interface between the inner wall 12 of the mold 10 and the sintered material 20 with the insulating layer 30 interposed therebetween. For example, the thickness is equal to or more than 0.001 mm and equal to or less than 5 mm.

It is preferable that the insulating layer 30 has voltage resistance that does not cause dielectric breakdown when a DC voltage of 10 V is applied in the first direction at 1000° C. for one second. Further, it is more preferable that the insulating layer 30 has voltage resistance that does not cause dielectric breakdown when a DC voltage of 10 V is applied in the first direction at 1400° C. for one second.

The material of the insulating layer 30 is not particularly limited as long as it has sufficient electric resistance, heat resistance, and voltage resistance. Here, the insulating layer 30 preferably has appropriate flexibility before the sintering step. In that case, the insulating layer 30 is not easily broken during the sintering step, and the insulating property can be maintained. In addition, a coefficient of linear expansion of the insulating layer 30 is preferably close to a coefficient of linear expansion of the mold 10 to some extent. With this, even if the temperature becomes higher in the sintering step, the insulating layer 30 and the mold 10 are not damaged due to mismatch of thermal expansion. For example, the coefficient of linear expansion of the mold 10 is preferably equal to or more than $\frac{1}{50}$-fold and equal to or less than 50-fold of the coefficient of linear expansion of the insulating layer 30.

Specifically, the insulating layer 30 preferably contains an insulating filler and binder. With this, the insulating layer 30 can have flexibility. Here, examples of the insulating filler include mica and aluminum nitride. In particular, from the viewpoint of improving flexibility, the insulating filler preferably includes mica. As the binder, for example, a resin material can be exemplified. In addition, the insulating layer 30 may be a ceramic plate or the like.

In the electric sintering method, the mold is filled with the sintered material and the voltage is applied while applying pressure. In that case, a sintered body obtained by sintering the sintered material is obtained. Here, when a voltage is applied, a current can flow through the sintered material and the mold. Then, Joule heat is generated in the sintered material and the mold through which the current has flowed, and the sintered material is sintered. Here, it is considered that the ratio of the magnitude of the current flowing in the sintered material to the magnitude of the current flowing in the mold is determined depending on the resistance ratio between the mold and the sintered material, the resistance between the die and the punch, and the resistance between the punch and the sintered material. For example, the fact that there is a gap between the punch and the die so that the punch is movable with respect to the die is a factor of increasing the resistance between the die and the punch.

Here, the thermoelectric conversion substance is a material having a particularly large Peltier effect. Accordingly, in a case where the sintered material is the thermoelectric conversion substance, when a current flows the sintered material, a temperature difference is generated between the positive electrode side and the negative electrode side of the sintered material. Specifically, in a case where the sintered material is an n-type thermoelectric conversion substance, the temperature on the positive electrode side becomes higher than the temperature on the negative electrode side. On the other hand, in a case where the sintered material is a p-type thermoelectric conversion substance, the temperature on the positive electrode side becomes lower than the temperature on the negative electrode side. In addition, in a case where the sintered material becomes the thermoelectric conversion substance by sintering, Peltier effect increases as the sintering progresses, and the same phenomenon occurs. As a result, sintering conditions differ between the portion close to the positive electrode and the portion close to the negative electrode side. As a result, in the obtained sintered body, a difference in the thermoelectric conversion properties and the like occurs between the positive electrode side and the negative electrode side, which causes quality unevenness.

Such an influence of unevenness becomes particularly conspicuous in a case of obtaining a large sintered body. The reason for this is that as the thickness of the sintered body is increased, the distance between the positive electrode side and the negative electrode side is increased and the temperature difference that occurs is also increased. In a case where individual pieces obtained by dividing the large sintered body are obtained as a thermoelectric conversion material, the thermoelectric conversion properties or the like of each piece are different depending on which part of the sintered body it is, and the quality becomes unstable.

For the above problems, in the method of manufacturing the thermoelectric conversion material according to this embodiment, the insulating layer is disposed between the inner wall of the mold and the sintered material, and energization is caused, thereby obtaining the sintered body. In that case, the current flowing in the sintered material is suppressed, and the main current flows in the mold. Therefore, the occurrence of temperature unevenness due to Peltier effect can be avoided. Then, the sintered material is sintered by Joule heat generated in the mold. Therefore, unevenness in the properties in the obtained sintered body is reduced, and the quality of the thermoelectric conversion material can be stabilized.

The properties of the thermoelectric conversion material are evaluated, for example, by a figure of merit Z. The figure of merit Z is represented by the following Expression (1) using Seebeck coefficient S, thermal conductivity κ, and electrical resistivity ρ.

$$Z=S^2/(\kappa\rho) \quad \text{Expression (1)}$$

In addition, the properties of the thermoelectric conversion material may be evaluated by the product of the figure of merit Z and a temperature T. In this case, both sides of the Expression (1) are multiplied by the temperature T (here, T is the absolute temperature) so as to obtain the following Expression (2).

$$ZT=S^2T/(\kappa\rho) \quad \text{Expression (2)}$$

ZT represented by Expression (2) is called a dimensionless figure of merit and is an index exhibiting the performance of the thermoelectric conversion material. In the thermoelectric conversion material, as the value of ZT becomes larger, the thermoelectric conversion performance at that temperature T becomes higher.

Also, the Seebeck coefficient and the Peltier coefficient are in a proportional relation. Further, as the material having a larger Peltier coefficient is used, the amount of heat absorption and generation per unit current becomes larger. Therefore, the sintering temperature unevenness due to the Peltier effect becomes conspicuous at the time of sintering as the thermoelectric conversion substance has the high thermoelectric conversion performance.

In the sintering step, a sintered body having the shape corresponding to the shape of an inner portion 14 of the mold 10 is obtained. The shape of the inner portion 14 of the mold 10 is not particularly limited, but it is, for example, a pillar shape such as a cube, a rectangular parallelepiped, a cylinder, and a polygonal pillar. In these pillar shapes, the relationship between the width of the bottom surface and the height is not particularly limited. The height may be smaller or larger than the width of the bottom surface. For example, the first surface 121 is one of the bottom surface and the top surface of the pillar, and the second surface 122 is the other of the bottom surface and the top surface of the pillar. The side surface of the pillar (corresponding to the side surface 123 of the mold 10 in this figure) may or may not have a curved surface. In a case where the side surface of the pillar has the curved surface, the insulating layer 30 may be or may not be disposed on the side surface of the pillar. In a case where the insulating layer 30 is not disposed on the side surface of the pillar, it is easy to dispose the insulating layer 30 because it is only necessary to dispose the insulating layer 30 on the flat bottom surface and the top surface. Further, heat conduction from the side surface 123 of the inner wall 12 of the mold 10 to the sintered material 20 becomes excellent. On the other hand, in a case where the insulating layer 30 is also disposed on the side surface of the pillar, it is possible to more reliably prevent a current from flowing through the sintered material 20. In addition, the insulating layer 30 may be disposed on the entire inner wall 12 of the mold 10.

Figure 2:
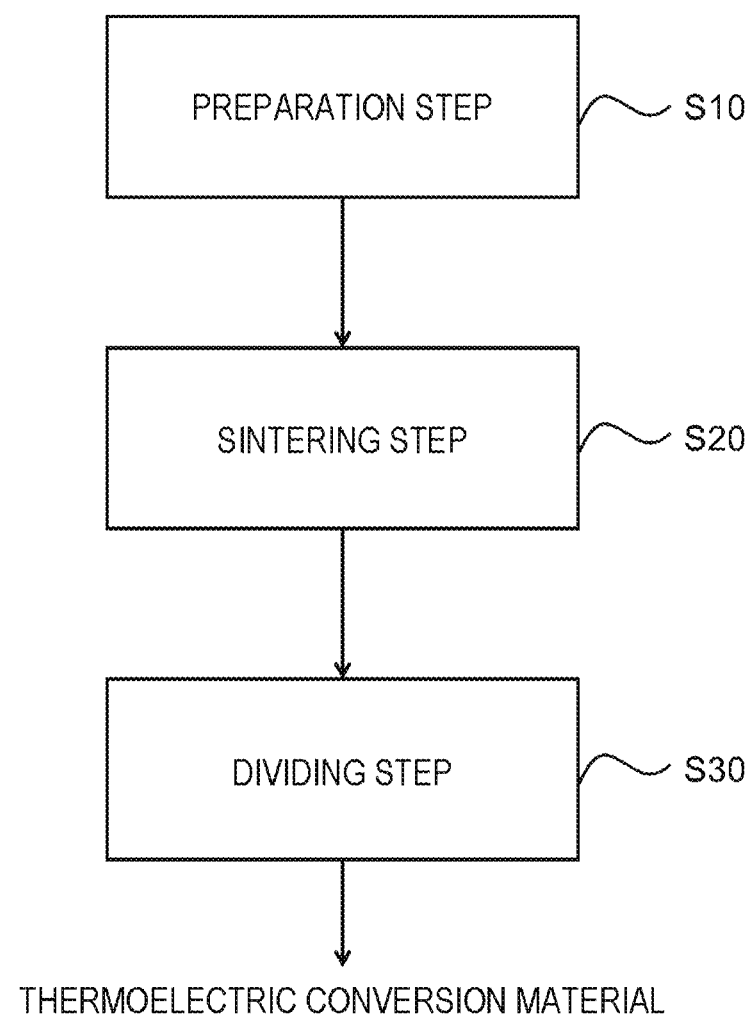
FIG. 2 is a diagram showing a flow of the method of manufacturing the thermoelectric conversion material according to the first embodiment.

FIG. 2 is a diagram showing a flow of the method of manufacturing the thermoelectric conversion material according to the first embodiment. The method of manufacturing a thermoelectric conversion material according to this embodiment further includes a preparation step S10 before the above-described sintering step S20. In addition, the method of manufacturing the thermoelectric conversion material further includes a step S30 of dividing the sintered body after the sintering step S20. In addition, the method of manufacturing a thermoelectric conversion material according to this embodiment includes, as a preparation step, a step of sandwiching the insulating sheet 30a as an insulating layer 30 at least in a portion between the inner wall 12 of the mold 10 and the sintered material 20.

Figure 3:
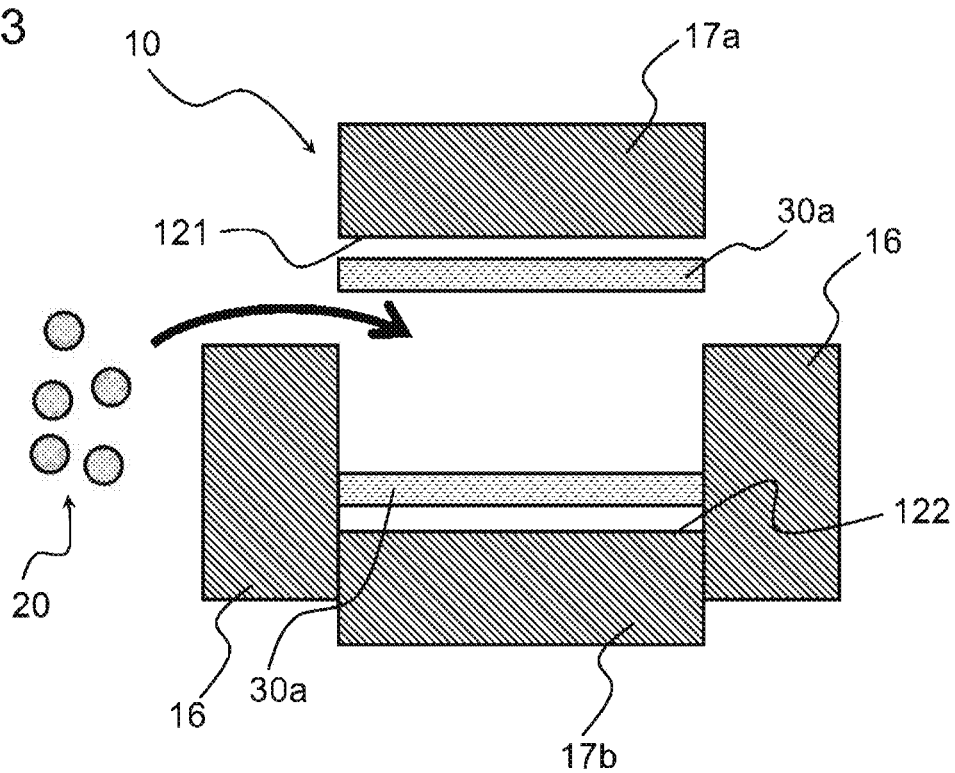
FIG. 3 is a diagram for illustrating a preparation step according to the first embodiment.

FIG. 3 is a diagram for illustrating the preparation step S10 according to the present embodiment. In this embodiment, the insulating layer 30 is the insulating sheet 30a. In the preparation step S10, a second punch 17b is disposed in the cylinder of the die 16. In addition, the insulating sheet 30a is disposed over the second punch 17b. Further, the sintered material 20 is stacked over the insulating sheet 30a, and the insulating sheet 30a and the first punch 17a are arranged over the sintered material 20 in this order.

The sintered material 20 is not particularly limited as long as the sintered body which is the thermoelectric conversion substance is obtained, and examples of the sintered body obtained from the sintered material 20 include a $Bi_2Te_3$-based thermoelectric conversion substance, a PbTe-based thermoelectric conversion substance, a GeTe—$AgSbTe_2$-based thermoelectric conversion substance, a SiGe-based thermoelectric conversion substance, a $Fe_2Si$-based thermoelectric conversion substance, a $Zn_4Sb_3$-based thermoelectric conversion substance, a skutterudite-based thermoelectric conversion substance, a Heusler-based thermoelectric conversion substance, a half-Heusler-based thermoelectric conversion substance, a clathrate-based thermoelectric conversion substance, a silicide-based thermoelectric conversion substance, a tetrahedrite-based thermoelectric conversion substance, and an oxide-based thermoelectric conversion substance. Note that, the thermoelectric conversion material obtained by the method according to this embodiment may be an n-type thermoelectric conversion material or a p-type thermoelectric conversion material. The sintered material 20 can be manufactured by using a known method of appropriately combining a melting method, a rapid solidification method (a gas atomization method, a water atomization method, a single roll method, and a twin roll method), a mechanical alloying method, a ball mill method, a bead mill method, and so on. The sintered material 20 is, for example, powdery, granular or agglomerated, and the material composition before sintering may be a single phase material or a multiphase material.

Next, in the sintering step S20, the sintered material 20 is heated to a temperature of, for example, equal to or more than 100° C. and equal to or less than 1400° C. by energizing in a vacuum or inert gas atmosphere. At the same time, one of the first punch 17a and the second punch 17b is pressed against the other, and a pressure of, for example, equal to or more than 1 MPa and equal to or less than 100 MPa is applied to the sintered material 20. A sintered body can be obtained by holding the sintered material for, for example, equal to or more than 1 minute and equal to or less than 300 minutes, and then cooled to room temperature. Here, for example, a pulse current (voltage) is applied during energization. A pulse current can be applied under the condition in which, for example, the average current value is more than 0 A and equal to or less than 1,000,000 A, and the average voltage value is more than 0 V and equal to or less than 36 V. Further, as an example, ON/OFF direct current pulses are controlled at ON/1 to 999, OFF/1 to 99 ms by using a spark plasma sintering device (JPX 150 G-II, manufactured by Sinter Land Incorporation), and a pulse current with a voltage of less than or equal to 10 V and a maximum applied current of 20,000 A can be applied. However, energization is carried out so that the insulating layer 30 does not cause dielectric breakdown.

The maximum width w in the direction perpendicular to the first direction of the sintered body obtained in the sintering step S20 is not particularly limited, but it may be, for example, more than or equal to 5 mm, and preferably more than or equal to 30 mm. The maximum width w in the direction perpendicular to the first direction is not particularly limited, but is, for example, equal to or less than 500 mm. In a case where the inner portion 14 of the mold 10 has a cylindrical shape, the maximum width w in the direction perpendicular to the first direction is a diameter of a circle on the bottom surface. In addition, in a case where a bottom surface is not a circle, or a cross-sectional shape is not constant along the first direction or the like, the maximum width w in the direction perpendicular to the first direction represents the maximum width among the widths which is in the direction perpendicular to the first direction.

The maximum thickness t in the first direction of the sintered body obtained in the sintering step S20 is not particularly limited, and for example, it can be set to be more than or equal to 0.1 mm, or preferably set to be more than or equal to 4 mm. In this embodiment, since energization is caused under the condition in which the insulating layer 30 is disposed between the sintered material 20 and the first surface 121 of the punch 17, the temperature unevenness due to the Peltier effect is suppressed. Therefore, even in the sintered body having a large thickness, variations in the properties can be reduced. The maximum thickness t of the sintered body in the first direction is not particularly limited, but is, for example, less than or equal to 200 mm. The maximum thickness t in the first direction corresponds to the distance between the bottom surface and the top surface of the column in a case where the sintered body has a pillar shape. Further, in a case where the sintered body has a shape in which the thickness in the first direction is not constant (for example, the first surface 121 of the first punch 17a and the second surface 122 of the second punch 17b are curved), the maximum thickness t indicates the maximum thickness among the thicknesses in the first direction.

Figure 4:
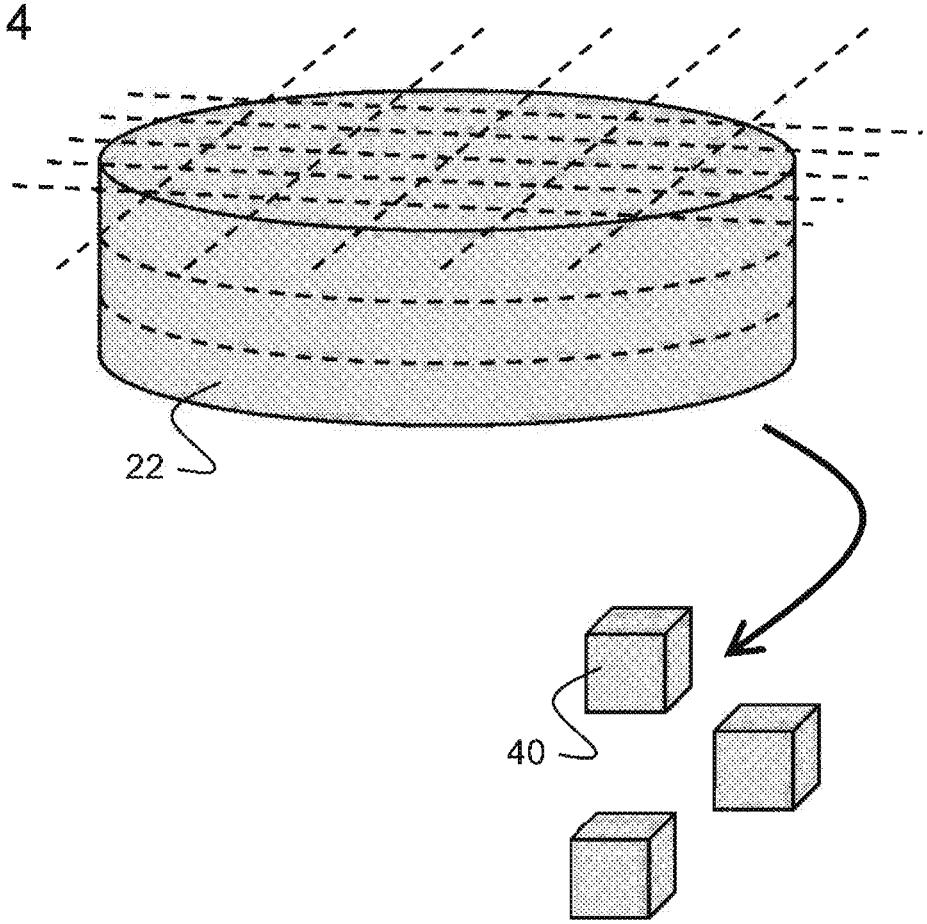
FIG. 4 is a diagram for illustrating a dividing step according to the first embodiment.

FIG. 4 is a diagram for illustrating a dividing step S30 according to the first embodiment. In the dividing step S30, a sintered body 22 obtained in the sintering step S20 is cut using, for example, a multi-wire saw, and then is divided into a plurality of thermoelectric conversion materials 40. With this, a thermoelectric conversion material 40 is obtained. In this figure, an example of the cut surface is indicated by a broken line. This figure shows an example of cutting in both a cross section perpendicular to the height direction of the sintered body 22 and a cross section parallel to the height direction of the sintered body 22 in a case where the sintered body 22 has a pillar shape. However, the cross section is not limited thereto, and the sintered body 22 may be cut only in a cross section perpendicular to the height direction of the sintered body 22, or may be cut only in a section parallel to the height direction of the sintered body 22. Note that, the dividing step S30 may not be carried out, and the sintered body 22 may be used as a thermoelectric conversion material. Even in that case, the thermoelectric conversion material with less sintering unevenness is obtained, and the thermoelectric conversion material can be manufactured with stable quality.

Next, actions and effects of the present embodiment will be described. According to this embodiment, also in a case of electrically sintering the thermoelectric conversion substance, the temperature unevenness can be suppressed, the sintering unevenness can be reduced, and thereby the thermoelectric conversion material can be manufactured with stable quality.

Second Embodiment

Figure 5:
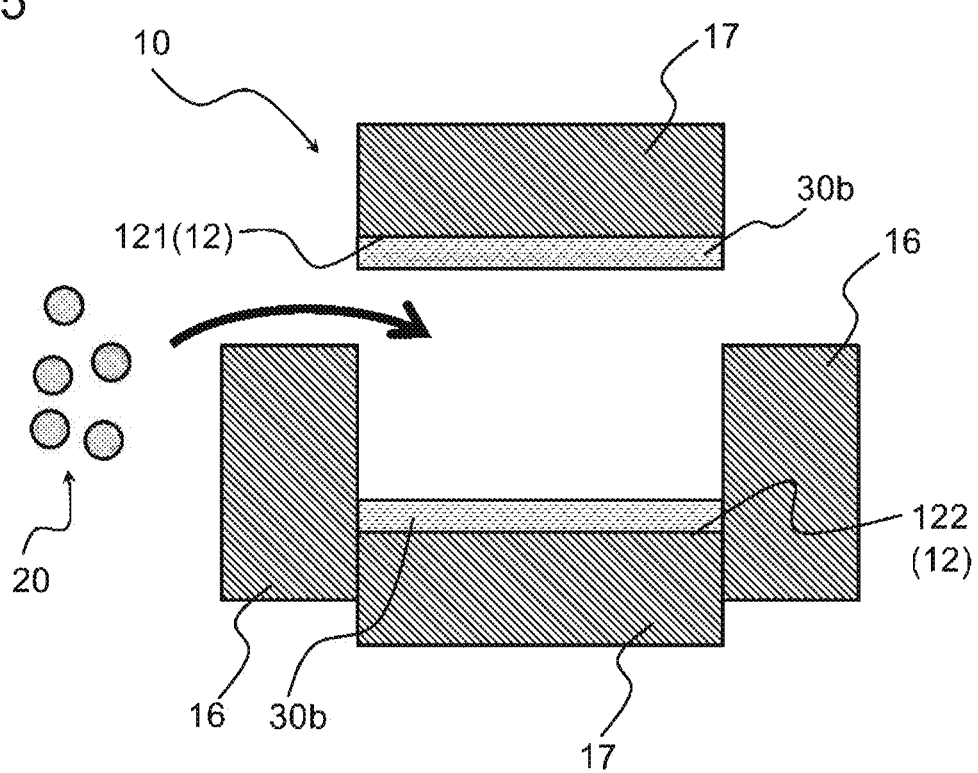
FIG. 5 is a diagram for illustrating a preparation step according to a second embodiment.

FIG. 5 is a diagram for illustrating a preparation step S10 according to a second embodiment. A method of manufacturing a thermoelectric conversion material according to this embodiment is the same as the method of manufacturing thermoelectric conversion material according to the first embodiment except for the preparation step S10.

The method of manufacturing a thermoelectric conversion material according to this embodiment further includes, before the sintering step S20, a step of filling the mold 10 with the insulating layer 30 formed so as to cover at least a portion of the inner wall 12, with the sintered material 20, as the preparation step S10.

The insulating layer 30 according to this embodiment is an insulating layer 30b formed so as to integrally cover the inner wall 12 of the mold 10. In this embodiment, the insulating layer 30 is integrally fixed to the punch 17 at the time before the sintering step S20. The insulating layer 30b can be formed, for example, by depositing an insulating material on the first surface 121 and the second surface 122 of the punch 17 by using a method such as thermal spraying, sputtering, or vapor deposition. Further, the insulating layer 30b can be formed by forming a film of an insulating material on the first surface 121 and the second surface 122 of the punch 17 by a coating method.

In the preparation step S10 according to this embodiment, as described above, the mold 10 with the insulating layer 30b formed so as to cover at least a portion of the inner wall 12, is filled with the sintered material 20. Then, in the sintering step S20 and subsequent steps, the thermoelectric conversion material is obtained in the same manner as in the first embodiment. Note that, in this embodiment, the method according to the first embodiment may be used in combination. That is, the sintering step S20 may be performed by disposing the insulating sheet so as to cover the other portion of the inner wall 12 of the mold 10 with the insulating layer 30b formed so as to cover at least a portion of the inner wall 12.

Next, actions and effects of the present embodiment will be described. According to this embodiment, the same actions and effects as those of the first embodiment can be obtained. In addition, since the insulating layer 30 and the mold 10 are integrated, it is easy to perform the step of filling the sintered material 20. In addition, the insulating layer 30 is not necessary to be replaced and can be repeatedly used for sintering, and thus cost reduction can be achieved.

EXAMPLES

Hereinafter, the embodiments will be described in detail with reference to examples. Note that, the embodiments are not limited to the description of these examples at all.

Manufacturing of Thermoelectric Conversion Material

Example 1

A sintering step is performed by using the same method described in the first embodiment so as to manufacture a Skutterudite type n-type thermoelectric conversion material. Here, graphite die and punch were used. As the insulating layer, an insulating sheet containing mica and a binder was used and disposed as shown in FIG. 1. The energization condition was a voltage of equal to or less than 5 V and the maximum applied current was 20,000 A. The obtained sintered body was cylindrical, the thickness was 3.7 mm, and the diameter of the bottom surface was 200 mm.

Example 2

An n-type thermoelectric conversion material was manufactured by using the same method as that used in Example 1 except that the thickness of the sintered body was set to be 20 mm.

Example 3

A Skutterudite type p-type thermoelectric conversion material was manufactured by using the same method as that used in Example 1 except that the composition of the sintered material was changed and the thickness of the sintered body was set to be 12 mm.

Comparative Example 1

An n-type thermoelectric conversion material was manufactured by using the same method as that used in Example 1 except that the sintering step was performed without the insulating layer and the thickness of the sintered body was set to be 3.8 mm.

Comparative Example 2

A p-type thermoelectric conversion material was manufactured by using the same method as that used in Comparative Example 1 except that the composition of the sintered material was changed and the thickness of the sintered body was set to be 4 mm.

Comparative Example 3

A p-type thermoelectric conversion material was manufactured by using the same method as that used in Comparative Example 2 except that the thickness of the sintered body was set to be 11 mm.

Evaluation

In the respective Examples and Comparative Examples, during the energization, a temperature of a center portion of an upper punch (corresponding to a first punch 17a in FIG. 1) on the positive electrode side was measured as a temperature of an upper portion of the sintered body, and a temperature of a center portion of a lower punch (corresponding to a second punch 17b in FIG. 1) on the negative electrode side was measured as a temperature of a lower portion of the sintered body.

Figure 6A:
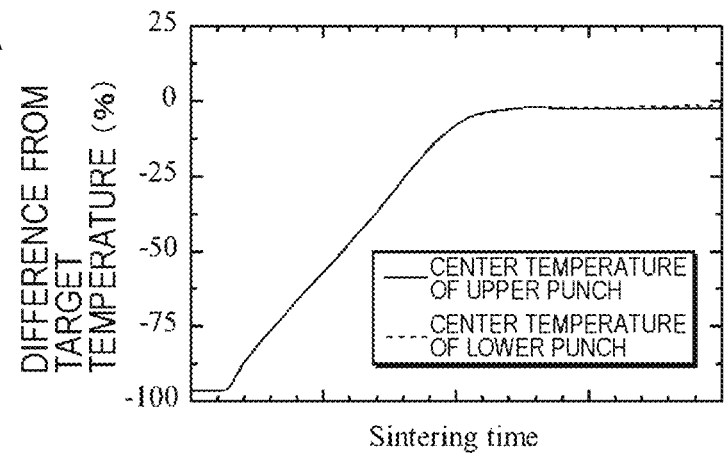
FIG. 6A is a diagram showing a center temperature of an upper punch and a lower punch in Example 1.
Figure 6B:
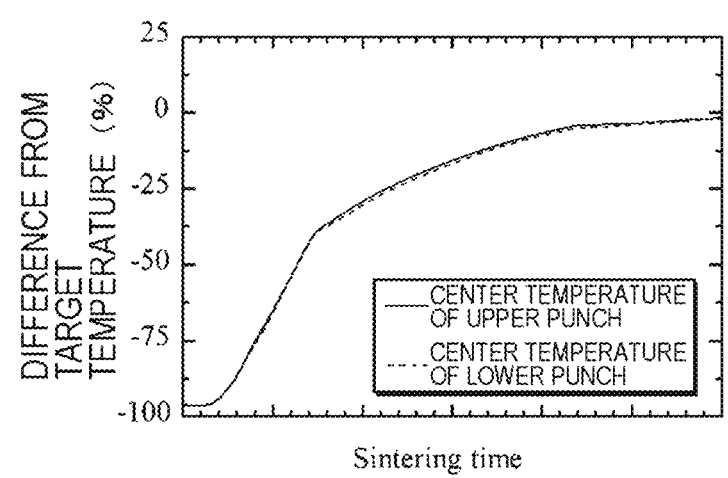
FIG. 6B is a diagram showing a center temperature of an upper punch and a lower punch in Example 2.
Figure 6C:
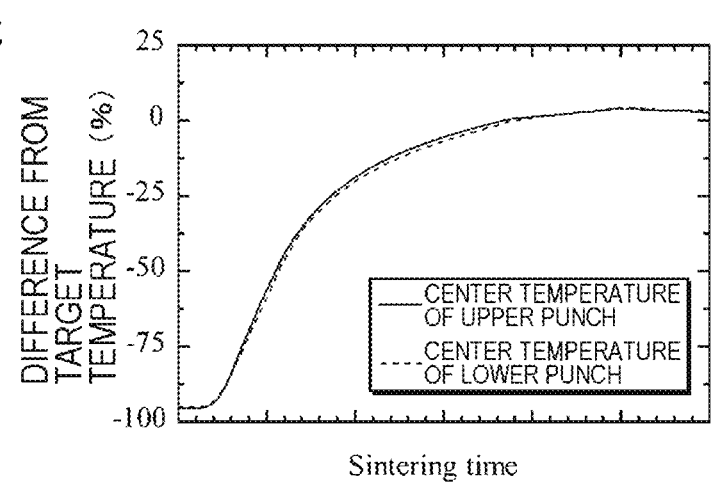
FIG. 6C is a diagram showing a center temperature of an upper punch and a lower punch in Example 3.
Figure 7A:
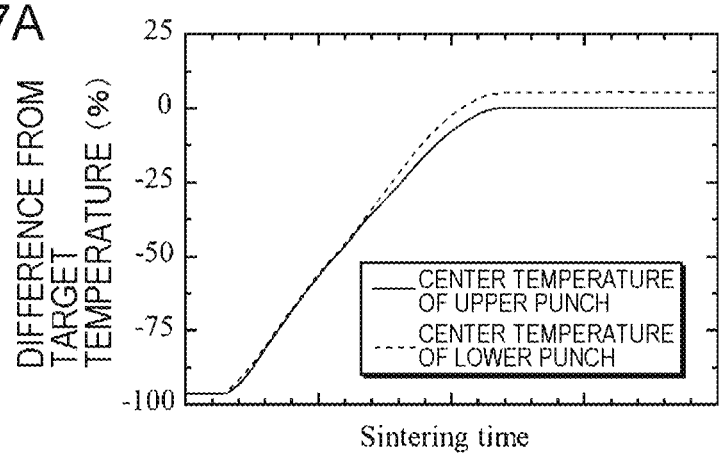
FIG. 7A is a diagram showing a center temperature of an upper punch and a lower punch in Comparative Example 1.
Figure 7B:
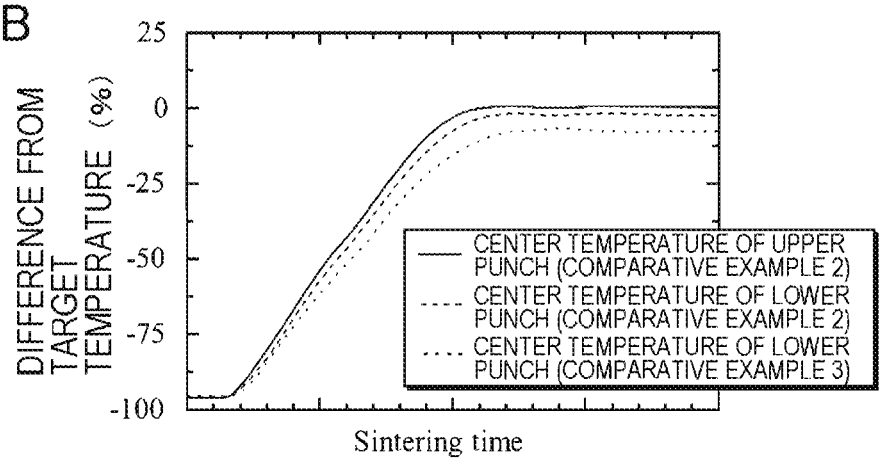
FIG. 7B is a diagram showing a center temperature of an upper punch and a lower punch in Comparative Example 2 and a center temperature of a lower punch in Comparative Example 3.

FIG. 6A is a diagram showing the center temperatures of the upper punch and the lower punch in Example 1. FIG. 6B is a diagram showing the center temperatures of the upper punch and the lower punch in Example 2. FIG. 6C is a diagram showing the center temperatures of the upper punch and the lower punch in Example 3. FIG. 7A is a diagram showing the center temperatures of the upper punch and the lower punch in Comparative Example 1. FIG. 7B is a diagram showing the center temperatures of the upper punch and the lower punch in Comparative Example 2, and the center temperature of the lower punch in Comparative Example 3. Note that, the center temperature of the upper punch in Comparative Example 3 is almost the same as the center temperature of the upper punch in Comparative Example 2. In FIG. 6A to FIG. 6C, and FIG. 7A and FIG.

7B, a horizontal axis represents time from the start of energization and a vertical axis represents the difference (%) from the target temperature. As shown in FIG. 6A to FIG. 6C, and FIG. 7A and FIG. 7B, in all of the comparative examples, a temperature difference was observed between the upper punch and the lower punch of the sintered body; whereas in the examples, the temperatures of the upper punch and the temperature of the lower punch were almost the same as each other. Therefore, it was confirmed that the temperature unevenness in the direction in which the voltage was applied was reduced in the example as compared with the comparative example.

In addition, the thermoelectric conversion material was obtained by dividing the sintered body of the respective examples and comparative examples. A dimensionless figure of merit ZT of a plurality of thermoelectric conversion materials obtained from different positions among the respective sintered bodies was measured.

Figure 8A:
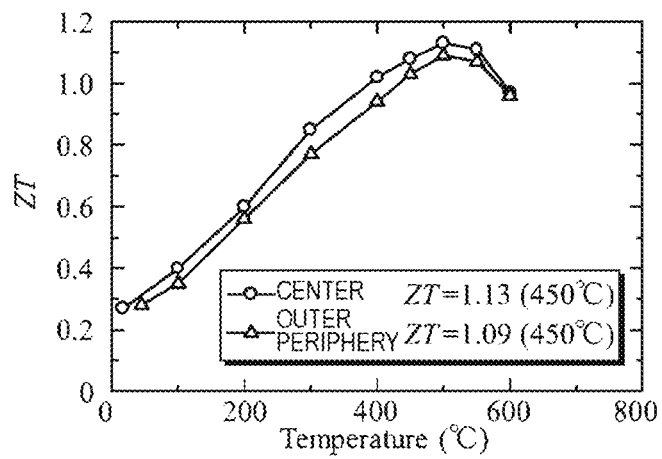
FIG. 8A is a diagram showing a relationship between a dimensionless figure of merit ZT and a temperature of the thermoelectric conversion material in Example 1.
Figure 8B:
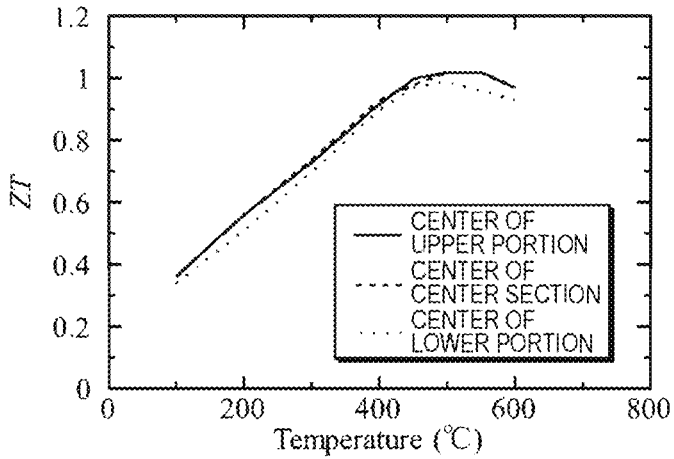
FIG. 8B is a diagram showing a relationship between a dimensionless figure of merit ZT and a temperature of the thermoelectric conversion material in Example 2.
Figure 8C:
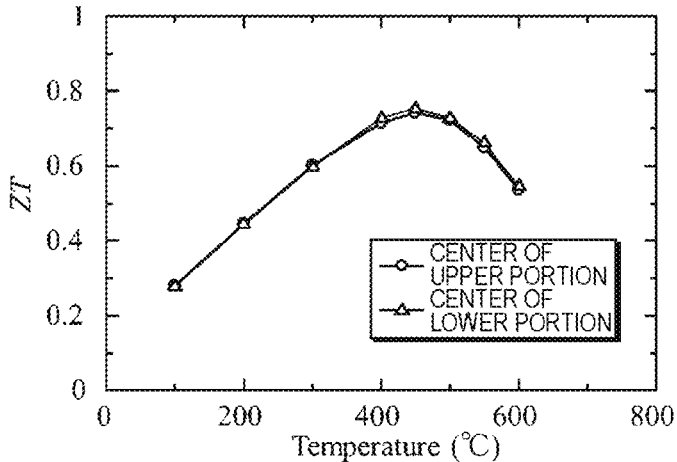
FIG. 8C is a diagram showing a relationship between a dimensionless figure of merit ZT and a temperature of the thermoelectric conversion material in Example 3.
Figure 9A:
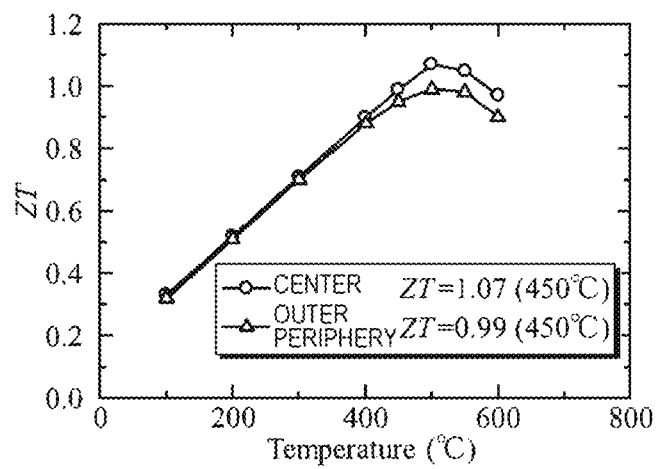
FIG. 9A is a diagram showing a relationship between a dimensionless figure of merit ZT and a temperature of the thermoelectric conversion material in Comparative Example 1.
Figure 9B:
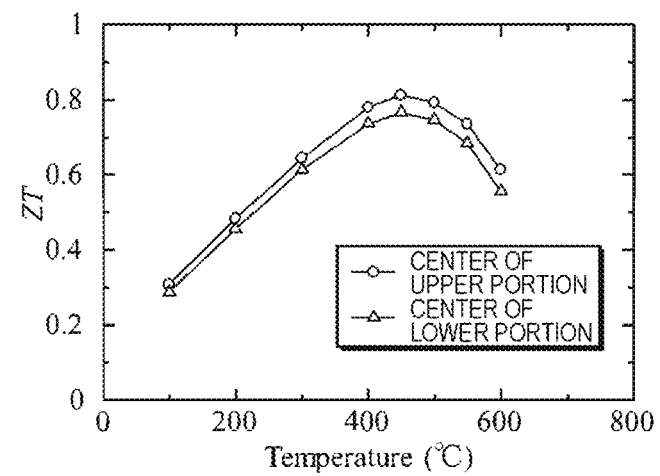
FIG. 9B is a diagram showing a relationship between a dimensionless figure of merit ZT and a temperature of the thermoelectric conversion material in Comparative Example 3.

FIG. 8A is a diagram showing the relationship between the dimensionless figure of merit ZT and the temperature of the thermoelectric conversion material in Example 1. In the drawing, the results of the thermoelectric conversion material cut out from the radially center portion of the obtained sintered body and the thermoelectric conversion material cut out from the radially outer peripheral portion are shown. FIG. 8B is a diagram showing the relationship between the dimensionless figure of merit ZT and the temperature of the thermoelectric conversion material in Example 2. In the drawing, the results of the thermoelectric conversion material cut out from the center of the cross section at the upper portion in the thickness direction of the obtained sintered body, the thermoelectric conversion material cut from the center portion in the thickness direction and the cross section, and the thermoelectric conversion material cut from the center of the cross section at the lower portion in the thickness direction are shown. FIG. 8C is a diagram showing the relationship between the dimensionless figure of merit ZT and the temperature of the thermoelectric conversion material in Example 3. In the drawing, the results of the thermoelectric conversion material cut out from the center of the cross section at the upper portion in the thickness direction of the obtained sintered body, and the thermoelectric conversion material cut from the center of the cross section at the lower portion in the thickness direction are shown. FIG. 9A is a diagram showing the relationship between the dimensionless figure of merit ZT and the temperature of the thermoelectric conversion material in Comparative Example 1. The results of the thermoelectric conversion material cut out from the radially center portion of the obtained sintered body and the thermoelectric conversion material cut out from the radially outer peripheral portion are shown. In addition, FIG. 9B is a diagram showing the relationship between the dimensionless figure of merit ZT and the temperature of the thermoelectric conversion material in Comparative Example 3. In the drawing, the results of the thermoelectric conversion material cut out from the center of the cross section at the upper portion in the thickness direction of the obtained sintered body, and the thermoelectric conversion material cut from the center of the cross section at the lower portion in the thickness direction are shown. Note that, the values of ZT at 450° C. are also shown in FIG. 8A and FIG. 9A.

As shown in FIG. 8A and FIG. 9A, in the thermoelectric conversion material of Example 1, the ZT value equal to or higher than that of Comparative Example 1 was obtained both in the central portion and the outer peripheral portion and sufficient thermoelectric conversion performance is exhibited. Further as shown in FIGS. 8B and 8C, and FIG. 9B, in the thermoelectric conversion materials of Examples 2 and 3, it was confirmed that the unevenness of the thermoelectric conversion properties in the thickness direction to which the voltage was applied was small, as compared with the thermoelectric conversion material of Comparative Example 3.

Figure 10:
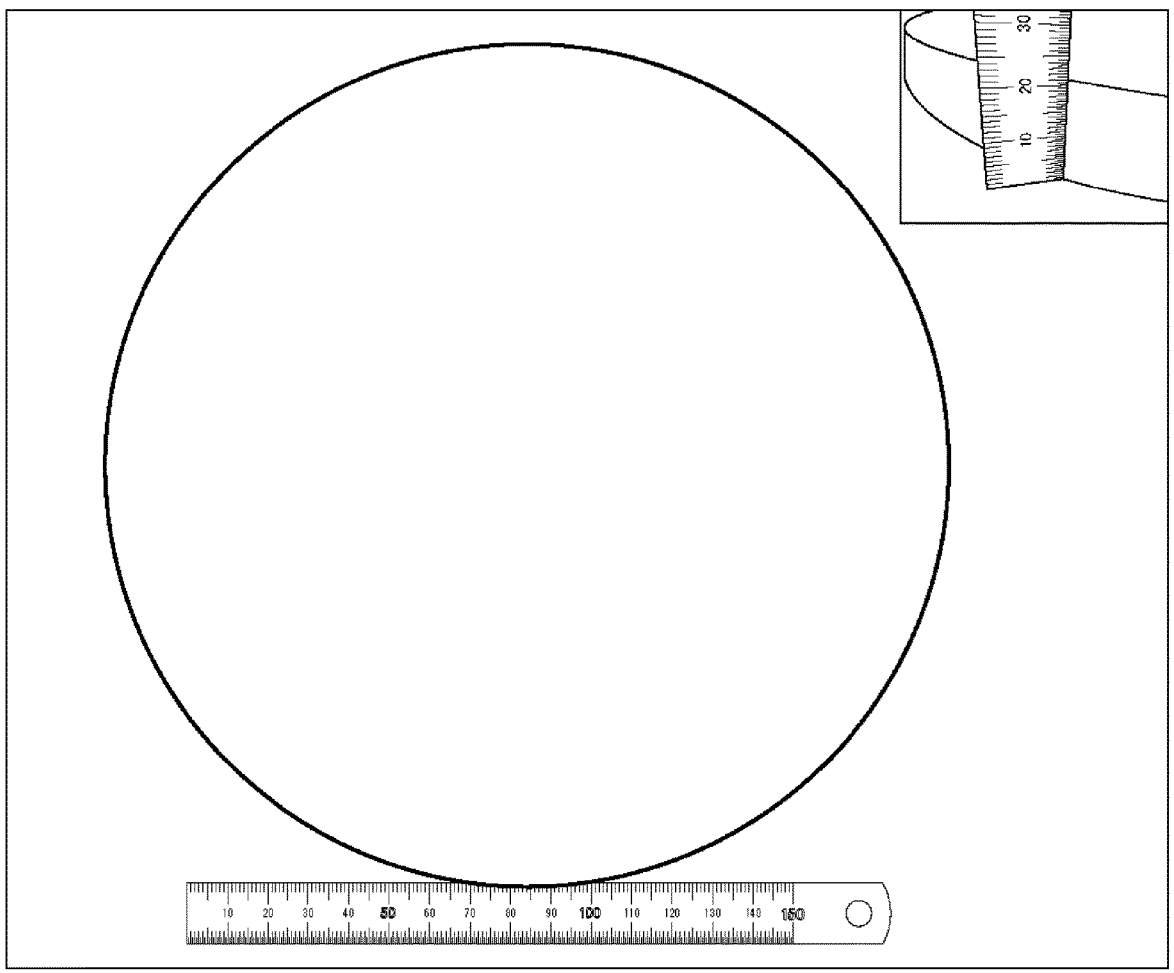
FIG. 10 is a picture illustrating a sintered body of Example 2.

Further, FIG. 10 is a picture showing the sintered body of Example 2. A large-sized and thick sintered body was obtained homogeneously.

Although the embodiments of the present invention have been described with reference to the drawings, these are examples of the present invention, and various configurations other than the above can be adopted.

Priority is claimed on Japanese Patent Application No. 2016-043195, filed on Mar. 7, 2016, the content of which is incorporated herein by reference.

The invention claimed is:

1. A method of manufacturing a thermoelectric conversion material, the method comprising:
    a step of filling a conductive mold with an insulating layer disposed on at least a portion of an inner wall of the mold, with a material, and
    a sintering step of obtaining a sintered body of the material by applying a voltage to the mold in a first direction so as to cause energization under a condition in which the insulating layer is disposed in at least a portion between the inner wall of the mold and the material in the first direction, and the insulating layer keeps having insulating properties, after the step of filling,
    wherein the material is a thermoelectric conversion substance or a substance which is converted to thermoelectric conversion substance by the sintering step,
    wherein the sintered body is the thermoelectric conversion substance, and
    wherein in the sintering step, the material is in contact with the insulating layer in the first direction.

2. The method of manufacturing a thermoelectric conversion material according to claim 1,
    wherein the voltage is applied between a positive electrode and a negative electrode,
    wherein the inner wall of the mold includes a first surface close to the positive electrode and a second surface close to the negative electrode, and
    wherein in the sintering step, the insulating layer is disposed so as to cover the first surface and the second surface.

3. The method of manufacturing a thermoelectric conversion material according to claim 2,
    wherein an inner portion of the mold has a pillar shape,
    wherein the first surface is one of a bottom surface and a top surface of the pillar,
    wherein the second surface is the other one of the bottom surface and the top surface of the pillar, and
    wherein a side surface of the pillar has a curved surface.

4. The method of manufacturing a thermoelectric conversion material according to claim 3,
    wherein the insulating layer is not disposed on the side surface of the pillar.

5. The method of manufacturing a thermoelectric conversion material according to claim 4,
    wherein a maximum width of the sintered body in a direction perpendicular to the first direction is set to be equal to or more than 30 mm and equal to or less than 500 mm.

6. The method of manufacturing a thermoelectric conversion material according to claim 1,
   wherein a maximum thickness of the sintered body in the first direction is set to be equal to or more than 4 mm and equal to or less than 200 mm.

7. The method of manufacturing a thermoelectric conversion material according to claim 1,
   wherein electrical resistivity of the insulating layer is higher than electrical resistivity of the material.

8. The method of manufacturing a thermoelectric conversion material according to claim 1,
   wherein the insulating layer is an insulating sheet, and
   wherein in the step of filling, the mold with the insulating sheet is filled with the material.

9. The method of manufacturing a thermoelectric conversion material according to claim 1, wherein the insulating layer is formed so as to integrally cover at least the portion of the inner wall.

10. The method of manufacturing a thermoelectric conversion material according to claim 1, further comprising:
    a step of dividing the sintered body after the sintering step.

11. The method of manufacturing a thermoelectric conversion material according to claim 1, wherein in the sintering step, the material is in direct contact with the insulating layer in the first direction.

* * * * *